United States Patent
Zhang et al.

(10) Patent No.: US 11,360,148 B2
(45) Date of Patent: Jun. 14, 2022

(54) METHOD FOR UPDATING CAPACITY OF BATTERY, DEVICE FOR UPDATING CAPACITY OF BATTERY, ELECTRONIC DEVICE, AND STORAGE UNIT

(71) Applicant: Dongguan NVT Technology Limited, Dongguan (CN)

(72) Inventors: BaiQing Zhang, Dongguan (CN); Hong Xie, Dongguan (CN); Ya-Qing Sun, Dongguan (CN); Zhi-Feng Wang, Dongguan (CN)

(73) Assignee: DONGGUAN NVT TECHNOLOGY LIMITED, Dongguan (CN)

( * ) Notice: Subject to any disclaimer, the term of this patent is extended or adjusted under 35 U.S.C. 154(b) by 218 days.

(21) Appl. No.: 16/899,392

(22) Filed: Jun. 11, 2020

(65) Prior Publication Data

US 2021/0080504 A1    Mar. 18, 2021

(30) Foreign Application Priority Data

Sep. 12, 2019    (CN) .......................... 201910866407.5

(51) Int. Cl.
  *G01R 31/367*    (2019.01)
  *G01R 31/3842*    (2019.01)
  *G01R 31/36*    (2020.01)

(52) U.S. Cl.
  CPC ....... *G01R 31/367* (2019.01); *G01R 31/3648* (2013.01); *G01R 31/3842* (2019.01)

(58) Field of Classification Search
  CPC .............. G01R 31/367; G01R 31/3648; G01R 31/3842; G01R 31/389; G01R 31/392; G01R 31/387; G01R 31/382
  USPC ......................................................... 320/132
  See application file for complete search history.

(56) References Cited

U.S. PATENT DOCUMENTS

| | | |
|---|---|---|
| 2014/0236511 A1 | 8/2014 | Kulkarni et al. |
| 2014/0244225 A1* | 8/2014 | Balasingam .......... G06F 30/367 703/2 |
| 2015/0293183 A1 | 10/2015 | Tenmyo et al. |
| 2016/0187432 A1 | 6/2016 | Saint-Marcoux et al. |
| 2018/0037130 A1 | 2/2018 | Ohkawa et al. |
| 2018/0252775 A1* | 9/2018 | Wu .................... G01R 31/3828 |
| 2020/0217898 A1* | 7/2020 | Lee ....................... G01R 31/386 |
| 2020/0309857 A1* | 10/2020 | Zeyghami ............. H02J 7/0068 |

FOREIGN PATENT DOCUMENTS

EP    3267552 A1    1/2018

\* cited by examiner

*Primary Examiner* — Paul Dinh
(74) *Attorney, Agent, or Firm* — Ladas & Parry LLP

(57) ABSTRACT

A method for updating a capacity of a battery for the information of a user includes detecting a state of charge-1 of the battery and an actual capacity-1 of the battery and determining a first state of charge according to the state of charge-1 of the battery. The method further includes determining a second state of charge according to the state of charge-1 of the battery and the actual capacity-1 of the battery and updating an actual capacity-2 of the battery according to the first state of charge and the second state of charge. An electronic device and a non-transitory storage medium are further provided.

28 Claims, 7 Drawing Sheets

METHOD FOR UPDATING CAPACITY OF BATTERY, DEVICE FOR UPDATING CAPACITY OF BATTERY, ELECTRONIC DEVICE, AND STORAGE UNIT

CROSS-REFERENCE TO RELATED APPLICATIONS

This application claims priority to Chinese Patent Application No. 201910866407.5 filed on Sep. 12, 2019 in the China Intellectual Property Office, the contents of which are incorporated by reference herein.

FIELD

The disclosure relates to batteries, and more particularly, to a method for updating the capacity of a battery, a device for updating the capacity of a battery, an electronic device, and a storage unit.

BACKGROUND

Lithium-ion batteries have wide application in large electronic equipment due to high energy density and long cycle-life. During the use of the lithium-ion batteries, capacity of the lithium-ion battery may degrade due to aging. When the capacity of the lithium-ion battery does not update in time, battery power will not display accurately and may even indicate a hopping behavior, which mill affect the use experience.

SUMMARY

An embodiment of the present application provides a method for updating the capacity of a battery, a device, an electronic device, and a storage unit for updating the capacity of a battery, can give timely updates of the capacity of a battery.

An embodiment of the present application provides a method for updating the capacity of a battery. The method for updating the capacity of a battery includes: detecting a state of charge-1 of the battery (hereinafter SOC-1) and an actual capacity-1 of the battery; determining a first state of charge (hereinafter first SOC) according to the SOC-1; determining a second state of charge (hereinafter second SOC) according to the SOC-1 and the actual capacity-1 of the battery; and updating an actual capacity-2 of the battery according to the first SOC and the second SOC.

According to some embodiments of the present application, the method for updating the capacity of a battery further includes: determining a state of charge-2 of the battery (hereinafter SOC-2) according to the first SOC and the second SOC.

According to some embodiments of the present application, the SOC-1 is an initialized SOC and the actual capacity-1 of the battery is a preset capacity when the second SOC is determined for the first time.

According to some embodiments of the present application, the method for updating the capacity of a battery further includes: determining an open-circuit voltage (hereinafter OCV); and determining the initialized SOC according to the OCV.

According to some embodiments of the present application, determining an open-circuit voltage includes: determining that the OCV is the current battery voltage.

According to some embodiments of the present application, determining the initialized SOC according to the OCV includes: querying the first relation model table to determine the initialized SOC according to the OCV.

According to some embodiments of the present application, determining a first state of charge (hereinafter first SOC) according to the SOC-1 includes: determining the first SOC according to the SOC-1 via Ohm's law.

According to some embodiments of the present application, determining the first SOC according to the SOC-1 via Ohm's law includes: determining the impedance of the battery according to the SOC-1: determining an OCV via Ohm's law $V_{alid\_OCV}=V_{bat}-I_{bat}*R(SOC,T_{bat})$, where $V_{bat}$ is the current battery voltage, $I_{bat}$ is the current battery current, and $R(SOC,T_{bat})$ is the impedance of the battery; and determining the first SOC according to the OCV.

According to some embodiments of the present application, determining the impedance of the battery according to the SOC-1 includes: querying the second relation model table to determine the impedance of the battery according to the SOC-1 and the current battery temperature.

According to some embodiments of the present application, determining a second state of charge (hereinafter second SOC) according, to the SOC-1 and the actual capacity-1 of the battery includes: determining the second SOC according to the SOC-1 and the actual capacity-1 of the battery via a coulomb counting method.

According to some embodiments of the present application, determining the second SOC according to the SOC-1 and the actual capacity-1 of the battery via a coulomb counting method includes: determining the second SOC according to the SOC-1, the current battery current, the sampling interval of obtaining the battery current, and the actual capacity-1 of the battery via the coulomb counting method.

According to some embodiments of the present application, the coulomb counting method includes: $SOC_2=SOC_0+I_{bat} \times \Delta t/Q_{abs}$; where $SOC_2$ is the second SOC, $SOC_0$ is the SOC-1, $I_{bat}$ is the current battery current, $\Delta t$ is the sampling interval of obtaining the battery current, and $Q_{abs}$ is the actual capacity-1 of the battery.

According to some embodiments of the present application, before updating an actual capacity-2 of the battery according to the first SOC and the second SOC, the method for updating the capacity of a battery further includes: determining that the battery meets at least one preset condition.

According to some embodiments of the present application, at least one preset condition includes at least one of: the current battery temperature is within a preset range; a product of the sampling interval of obtaining the battery current and the current battery current obtained in the dead time is less than or equal to a preset threshold; the OCV is within a stable region of the first relation model table; and the difference between the SOC-2 and the initialized SOC or the difference between the SOC-2 and a state of charge (hereinafter SOC) calculated of the previous moment according to the actual capacity-2 of the battery is greater than a preset value.

According to some embodiments of the present application, updating the actual capacity-2 of the battery according to the first SOC and the second SOC includes: updating the actual capacity-2 of the battery according to the following equation $Pre1\_Q_{abs}(1+(SOC_1-SOC_2)) \times Q_{abs}-Q_{com}$ if the first SOC is greater than the second SOC, where $Pre1\_Q_{abs}$ is an actual capacity-3 of the battery, $SOC_1$ is the first SOC, $SOC_2$ is the second SOC, $Q_{abs}$ is the actual capacity-1 of the battery, and $Q_{com}$ is the compensation value.

According to some embodiments of the present application, the method for updating the capacity of a battery includes: updating the actual capacity-2 of the battery according to the following equation $Pre1\_Q_{abs}=(1+(SOC_2-SOC_1))\times Q_{abs}+Q_{com}$ if the first SOC is less than the second SOC, where $Pre1\_Q_{abs}$ is the actual capacity-3 of the battery, $SOC_2$ is the second SOC, $SOC_1$ is the first SOC, $Q_{abs}$ is the actual capacity-1 of the battery, and $Q_{com}$ is the compensation value.

According to some embodiments of the present application, the compensation value is zero when the first SOC and the second SOC are each within a preset interval.

According to some embodiments of the present application, a lower threshold of the preset interval is 0.0, and an upper threshold of the preset interval is 1.0.

According to some embodiments of the present application, the method for updating the capacity of a battery further includes: updating the actual capacity-2 of the battery as the actual capacity-3 of the battery.

According to some embodiments of the present application, the method for updating the capacity of a battery further includes: updating the actual capacity-2 of the battery according to the following equation $Pre2\_Q_{abs}=Q_{abs}+Q_{t2}$ if the difference between the actual capacity-3 and the actual capacity-1 is greater than the first threshold, where $Pre2\_Q_{abs}$ is the actual capacity-2 of the battery, $Q_{abs}$ is the actual capacity-1 of the battery, and Qt2 is the first threshold.

According to some embodiments of the present application, a method for updating the capacity of a battery further includes: updating the actual capacity-2 of the battery according to the following equation $Pre2\_Q_{abs}=Q_{abs}-Q_{t2}$ if the difference between the actual capacity-3 and the actual capacity-1 is less than a negative value of the first threshold, where $Pre2\_Q_{abs}$ is the actual capacity-2 of the battery, $Q_{abs}$ is the actual capacity-1 of the battery, and Qt2 is the first threshold.

According to some embodiments of the present application, updating the actual capacity-2 of the battery as the actual capacity-3 of the battery when the difference between the actual capacity-3 and the actual capacity-1 is less than the first threshold and greater than the negative value of the first threshold.

According to some embodiments of the present application, the first threshold is equal to $f_1*Q_{design}$, where $f_1$ is a value between a lower threshold 0.03 and an upper threshold 0.1, and $Q_{design}$ is the preset capacity.

According to some embodiments of the present application, the method for updating the capacity of a battery further includes: updating the actual capacity-2 of the battery according to the following equation $Pre2\_Q_{abs}=Q_{t3}$ if the actual capacity-3 of the battery is greater than the second threshold, where $Pre2\_Q_{abs}$ is the actual capacity-2 of the battery, and $Q_{t3}$ is the second threshold.

According to some embodiments of the present application, the second threshold is equal to $f_2*Q_{design}$, where $f_2$ is a value between a lower threshold 1.1 and an upper threshold 1.5, and $Q_{design}$ is the preset capacity.

According to some embodiments of the present application, the method for updating the capacity of a battery further includes: stopping the update of the first SOC if the battery is in charging state or discharging state: and updating the first SOC according to the SOC-1 if the battery is in idle state.

According to some embodiments of the present application, the method for updating the capacity of a battery further includes: detecting the battery state. The battery state is one of the charging state, the discharging state, and the idle state.

According to some embodiments of the present application, the method for updating the capacity of a battery further includes: updating the second SOC according to the SOC-1 and the actual capacity-1 of the battery if the battery is in the charging state or the discharging state; and keeping the value of the second SOC if the battery is in the idle state.

An embodiment of the present application provides a device for updating the capacity of a battery. The device for updating the capacity of a battery includes: a detection module configured for detecting a SOC-1 and an actual capacity-1 of the battery; a first SOC determining module configured for determining a first SOC according to the SOC-1; a second SOC determining module configured for determining a second SOC according to the SOC-1 and the actual capacity-1 of the battery; an updating module configured for updating an actual capacity-2 of the battery according to the first SOC and the second SOC.

According to some embodiments of the present application, the SOC-1 is an initialized SOC and the actual capacity-1 of the battery is a preset capacity when the second SOC is determined at the first time.

According to some embodiments of the present application, the second SOC determining module is further configured for: determining an OCV; and determining the initialized SOC according to the OCV.

According to some embodiments of the present application, determining an OCV includes: determining that the OCV is the current battery voltage.

According to some embodiments of the present application, determining the initialized SOC according to the OCV includes: querying the first relation model table to determine the initialized SOC according to the OCV.

According to some embodiments of the present application, the first SOC determining module is configured for determining the first SOC according to the SOC-1 via Ohm's law.

According to some embodiments of the present application, the first SOC determining module is configured for: determining the impedance of the battery according to the SOC-1; determining an OCV via Ohm's law $V_{alid\_OCV}=V_{bat}-I_{bat}*R(SOC,T_{bat})$, where $V_{bat}$ is the current battery voltage, $I_{bat}$ is the current battery current, and $R(SOC,T_{bat})$ is the impedance of the battery; and determining the first SOC according to the OCV.

According to some embodiments of the present application, determining the impedance of the battery according to the SOC-1 includes: querying the second relation model table to determine the impedance of the battery according to the SOC-1 and the current battery temperature.

An embodiment of the present application provides an electronic device. The electronic device includes a battery, at least one processor, and a storage system storing one or more programs that when executed by the at least one processor perform any one of the foregoing methods for updating a capacity of a battery.

An embodiment of the present application provides a non-transitory storage unit. The non-transitory storage unit has stored thereon instructions that when executed by at least one processor of an electronic device, perform any one of the foregoing methods for updating a capacity of a battery.

The method for updating the capacity of a battery, the device for updating the capacity of a battery, the electronic device, and the storage unit provided by the present disclosure detect the SOC-1 and the actual capacity-1 of the battery; determine the first SOC according to the SOC-1; determine the second SOC according to the SOC-1 and the actual capacity-1 of the battery; and update the actual capacity-2 of the battery according to the first SOC and the second SOC. Thus, the method for updating the capacity of a battery, the device for updating the capacity of a battery, the electronic device, and the storage unit provided by the present disclosure can provide timely updates for the capacity of the battery.

BRIEF DESCRIPTION OF THE DRAWINGS

Implementations of the present disclosure will now be described, by the way of embodiments, with reference to the attached figures.

The numerical symbols for main elements are: 100 represents an electronic device, 10 represents a device for updating the capacity of a battery, 11 represents a storage unit, 12 represents at least one processor, 13 represents a battery, 14 represents an analog, to digital converter, 15 represents a sensor, 801 represents a detection module, 802 represents a first SOC determining module, 803 represents a second SOC determining module, and 804 represents an updating module.

Implementations of the disclosure are described, with reference to the drawings.

DETAILED DESCRIPTION

Implementations of the disclosure are described, by the way of embodiments only, with reference to the drawings. The disclosure is illustrative only, and changes may be made in the detail within the principles of the present disclosure.

Unless otherwise defined, all technical terms used herein have the same meaning as commonly understood by one of ordinary skill in the art. The technical terms used herein are not to be considered as limiting the scope of the embodiments.

Implementations of the disclosure will now be described, by the way of embodiments only, with reference to the drawings. It should be noted that non-conflicting details and features in the embodiments of the present disclosure may be combined with each other.

Figure 1:
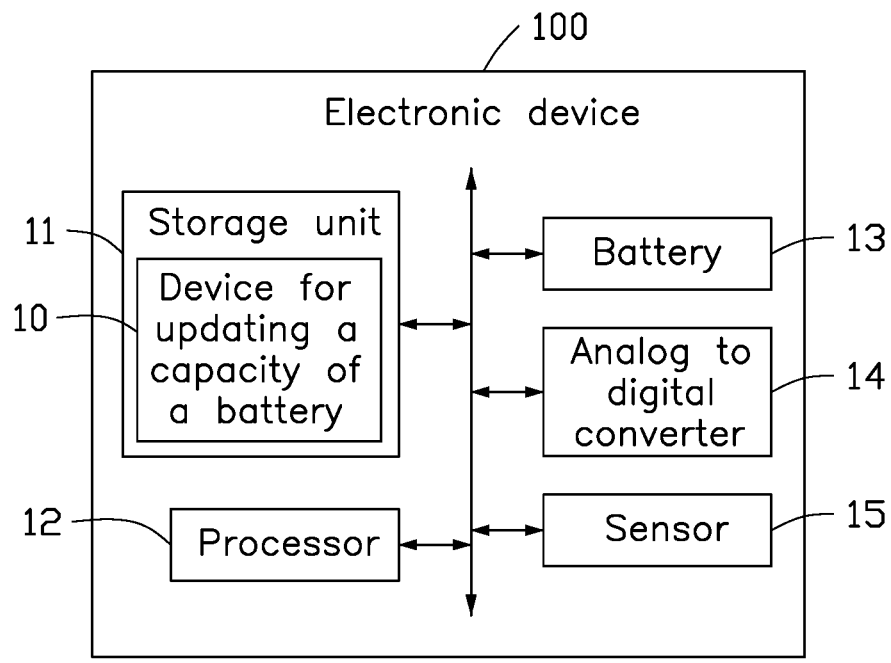
FIG. 1 is a block diagram of an electronic device.

Referring to FIG. 1, a device for updating the capacity of a battery 10 is run on an electronic device 100. The electronic device 100 can include, but not limited to, a storage unit 11, at least one processor 12, a battery 13, an analog to digital converter 14, and a sensor 15. The foregoing components can be interconnected via a bus, or interconnected directly.

FIG. 1 illustrates only one example of the electronic device 100, other examples can include more or fewer components than those shown in the embodiment, or have a different configuration of the various components. The electronic device 100 can be, but not limited to, an electric motorcycle, an electric bicycle, an electric car, a mobile phone, a tablet computer, a personal digital assistant (PDA), a personal computer, or any other suitable rechargeable electronic device.

In at least one embodiment, the battery 13 is a rechargeable battery supplying power to the electronic device 100. For example, the battery 13 may be a lead-acid battery, a nickel-cadmium battery, a nickel-metal hydride battery, a lithium-ion battery, a lithium polymer battery, a lithium iron phosphate battery, or the like. The battery 13 is logically coupled to the at least one processor 12 via a battery management system (hereinafter BMS), to implement charge function, discharge function, or the like, via the BMS. The BMS can be communicationally coupled to a power conversion system (hereinafter PCS) via CAN bus or RS485. The battery 13 includes a battery cell.

In the embodiment, the analog to digital converter 14 is configured for collecting the voltage of the battery cell of the battery 13 and the current of the battery cell of the battery 13 during a charging state, a discharging state, or an idle state. In the embodiment, the analog to digital converter 14 includes a digital filter. The digital filter is configured for filtering the voltage of the battery cell of the battery 13 and the current of the battery cell of the battery 13 during the charging state, the discharging state, and the idle state. In at least one embodiment, the digital filter is a first order low pass filter. The analog to digital converter 14 processes the collected data, for example filtering, and so on. The analog to digital converter has dead time. The sensor 15 is configured for collecting the temperature of the battery cell of the battery 13 during the charging state, the discharging state, or the idle state. In at least one embodiment, the sensor 15 is a negative temperature coefficient thermistor. It can be understood that, the electronic device 100 can further include other components, for example, a pressure sensor, a light sensor, a gyroscope, a hygrometer, an infrared sensor, and so on.

Figure 2:
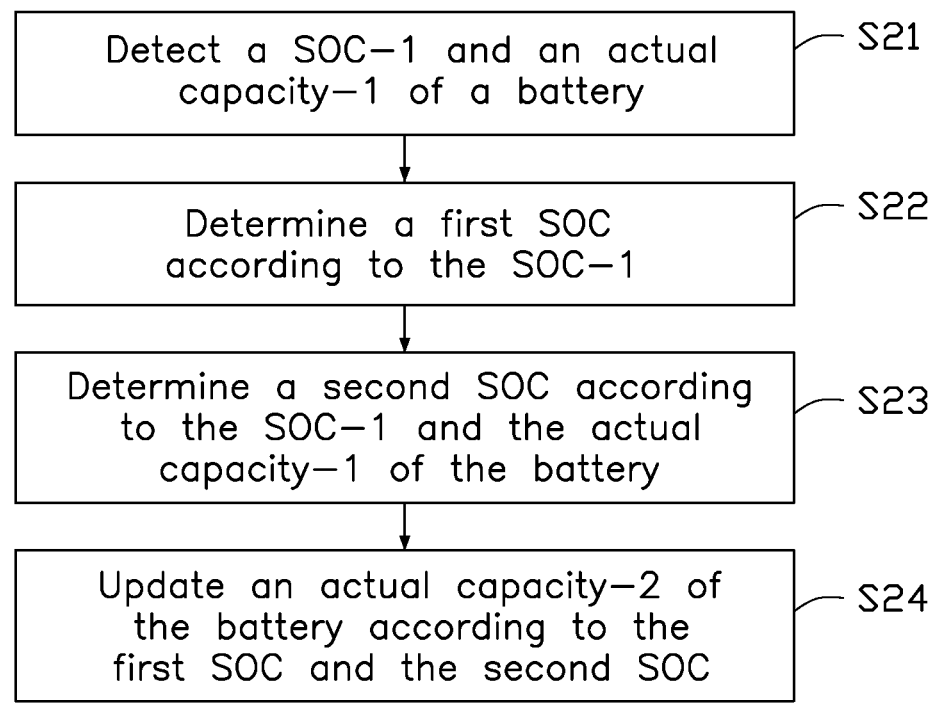
FIG. 2 is a flowchart of a method for updating the capacity of a battery.

Referring to FIG. 2, FIG. 2 shows a method for updating the capacity of a battery. A SOC-1 of the present disclosure is a previous SOC of the battery, and an actual capacity-1 of the battery is a previous actual capacity of the battery. A SOC-2 is a current SOC of the battery, and an actual capacity-2 of the battery is a current actual capacity of the battery. The present disclosure detects the SOC-1 and the actual capacity-1 of the battery, and determines a first SOC according to the SOC-1. The present disclosure further determines a second SOC according to the SOC-1 and the actual capacity-1 of the battery, and updates an actual capacity-2 of the battery according to the first SOC and the second SOC. Thus, the present disclosure updates the current actual capacity of the battery according to the previous SOC of the battery and the previous actual capacity of the battery, and uses the current SOC of the battery and the current actual capacity of the battery as inputs to determine a next actual capacity of the battery.

The method for updating the capacity of a battery includes the following:

Step S21, detecting the SOC-1 and the actual capacity-1 of the battery.

In the embodiment, the SOC-1 and the actual capacity-1 of the battery are detected by calculating an initialized SOC and obtaining a preset capacity. In the embodiment, the calculating an initialized SOC includes:

a1: determining an OCV.

Determining an OCV includes determining that the OCV is a current battery voltage. In the embodiment, before detecting the SOC-1 and the actual capacity-1 of the battery, the method further includes: obtaining a current battery voltage, a current battery current, and a current battery temperature.

In the embodiment, determining that the OCV is the current battery voltage is as follows:

When the battery is, just powering on, the OCV is determined via Ohm's law $V_{alid}=V-I*R(SOC,T)$, namely determining that the current when the battery is just powering on is zero and determining that the OCV is the current battery voltage. Where, $V_{alid}$ is the OCV, V is the voltage of the battery when the battery is just powering on, I is the current of the battery when the battery is just powering on, R(SOC,T) is a impedance of the battery when the battery is just powering on, SOC is a SOC of the battery when the battery is just powering on, and T is a temperature of the battery when the battery is just powering on.

a2: determining the initialized SOC according to the OCV.

Determining the initialized SOC according to the OCV includes: querying a first relation model table to determine the initialized SOC according to the OCV. In the embodiment, the first relation model table includes a relationship of open-circuit voltage vs. state of charge which is preset ("preset OCV vs. SOC relationship"). Querying, the first relation model table to determine the initialized SOC according to the OCV includes: querying a first open-circuit voltage (first OCV) which is in the first relation model table and matching the OCV; and determining that the SOC of the battery in the first relation model table corresponding to the determined first OCV as the initialized SOC.

Figure 3:
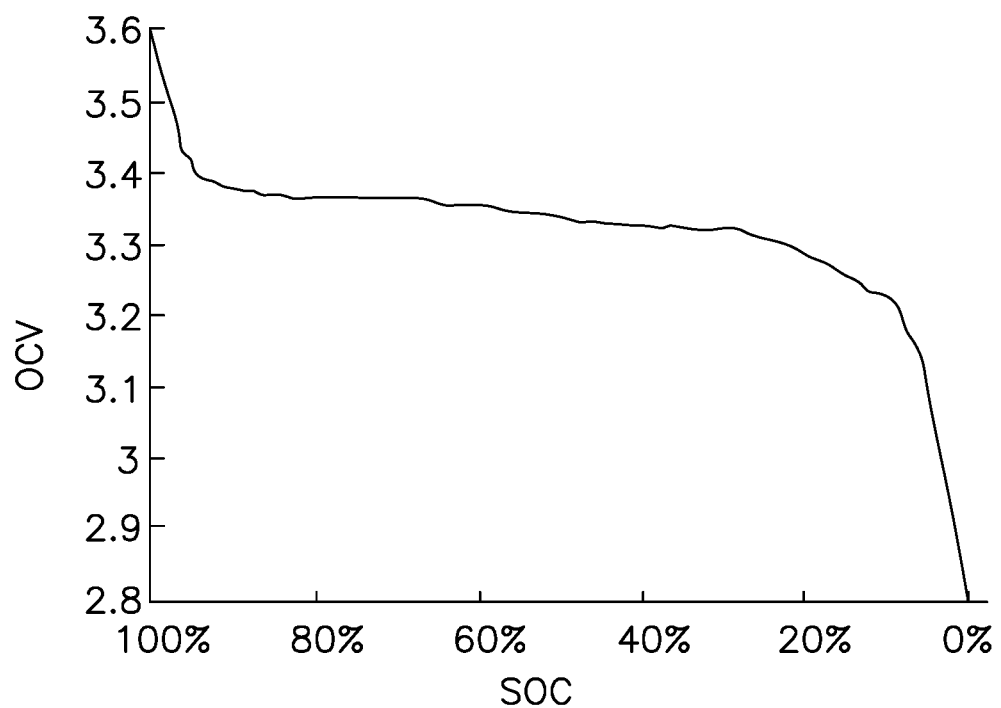
FIG. 3 shows chart of state of charge vs. open-circuit voltage (hereinafter SOC vs. OCV).

In the embodiment, the first relation model table can be a curve chart, as shown in FIG. 3. In other embodiments, the first relation model table can be a relation table, or the like.

In the embodiment, the preset capacity is prestored in the battery.

In the embodiment, the SOC-1 and the actual capacity-1 of the battery can be detected by obtaining a calculated SOC-1 and a calculated actual capacity-1 of the battery.

Step S22, determining the first SOC according to the SOC-1.

In the embodiment, the method further includes: stopping an update of the first SOC if the battery is in the charging state or the discharging state; and updating the first SOC according to the SOC-1 if the battery is in the idle state.

In the embodiment, determining the first SOC according to the SOC-1 includes: determining the first SOC according to the SOC-1 via Ohm's law. Determining the first SOC according to the SOC-1 via Ohm's law includes:

b1: determining the impedance of the battery according to the SOC-1.

In the embodiment, determining the impedance of the battery according to the SOC-1 includes: querying a second relation model table to determine the impedance of the battery according to the SOC-1 and the current battery temperature. In the embodiment, the second relation model table can be a prestored relation table regarding the impedance of the battery, the SOC of the battery, and the temperature of the battery. Querying a second relation model table to determine the impedance of the battery according to the SOC-1 and the current battery temperature includes: determining the SOC of the battery and the temperature of the battery which are in the second relation model table and respectively matching the SOC-1 and the current battery temperature; and determining that the impedance of the battery in the second relation model table which corresponds to the determined SOC of the battery and the determined temperature of the battery is the aforementioned impedance of the battery.

b2: determining an OCV via Ohm's law $V_{alid\_OCV}=V_{bat}-I_{bat}*R(SOC,T_{bat})$, where $V_{bat}$ is the current battery voltage, $I_{bat}$ is the current battery current, and $R(SOC,T_{bat})$ is the impedance of the battery.

b3: determining the first SOC according to the OCV.

Determining the first SOC according to the OCV includes: querying the first relation model table to determine the first SOC according to the OCV In the embodiment, querying the first relation model table to determine the first SOC according to the OCV includes: querying a second open-circuit voltage (hereinafter second OCV) which is in the first relation model table and matching the OCV; and determining that the SOC of the battery in the first relation model table which corresponds to the determined second OCV is the first SOC.

Step S23, determining the second SOC according to the SOC-1 and the actual capacity-1 of the battery.

In the embodiment, the method further includes: updating the second SOC according to the SOC-1 and the actual capacity-1 of the battery if the battery is in the charging state or the discharging state; and keeping the value of the second SOC if the battery is in the idle state.

In the embodiment, determining the second SOC according to the SOC-1 and the actual capacity-1 of the battery includes: determining the second SOC according to the SOC-1 and the actual capacity-1 of the battery via the coulomb counting method. Determining the second SOC according to the SOC-1 and the actual capacity-1 of the battery via the coulomb counting method includes: determining the second SOC according to the SOC-1, the current battery current, the sampling interval of obtaining the battery current, and the actual capacity-1 of the battery via the coulomb counting method.

In the embodiment, the coulomb counting method includes: $SOC_2=SOC_0+I_{bat}\times \Delta t/Q_{abs}$; where $SOC_2$ is the second SOC, $SOC_0$ is the SOC-1, $I_{bat}$ is the current battery current, $\Delta t$ is the sampling interval of obtaining the battery current, and $Q_{abs}$ is the actual capacity-1 of the battery.

In the embodiment, when the second SOC is determined for the first time, the SOC-1 is the initialized SOC and the actual capacity-1 of the battery is the preset capacity. When the second SOC is not determined for the first time, the SOC-1 is the calculated SOC-1 and the actual capacity-1 of the battery is the calculated actual capacity-1 of the battery. The calculated SOC-1 can be the first SOC calculated via Ohm's law at the idle state before the battery enters the charging state or the discharging state, or the second SOC calculated via the coulomb counting method when the battery is in the charging state or the discharging state. The actual capacity-1 of the battery can be the actual capacity-1 of the battery calculated when the battery is in the charging state, the discharging state, or the idle state.

Figure 4:
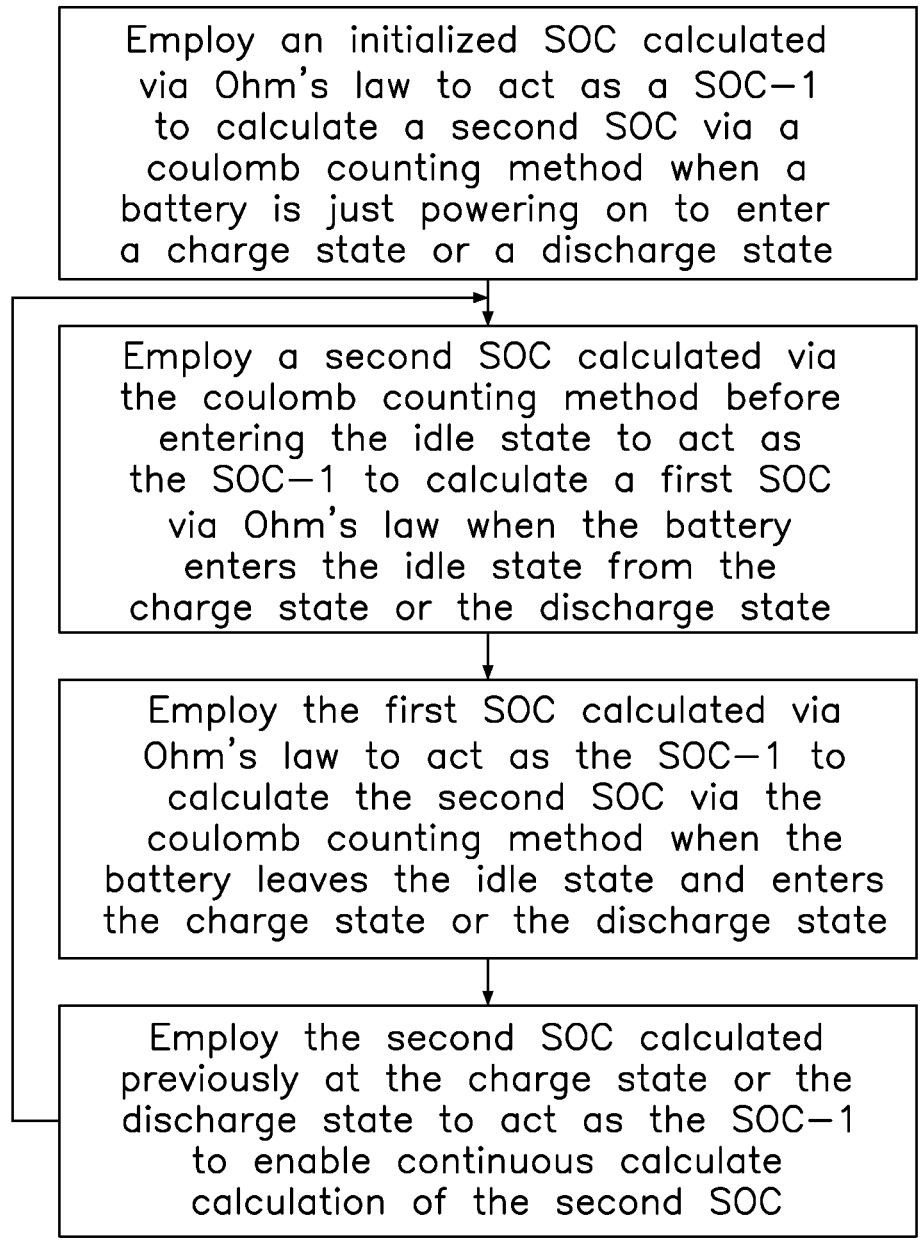
FIG. 4 is a flowchart describing a process for iteratively calculating a SOC of a battery via a first SOC calculated via Ohm's law and a second SOC calculated via a coulomb counting method.

In the embodiment, the SOC of the battery is iteratively calculated via the first SOC calculated via Ohm's law and the second SOC calculated via the coulomb counting method. As shown in FIG. 4, the method includes when the battery leaves the idle state and enters the charging state or the discharging state or when the battery is just powering on to enter the charging state or the discharging state, employing the first SOC calculated via the Ohm's law or the initialized SOC calculated via Ohm's law to act as the SOC-1 to calculate the second SOC via the coulomb counting method. Employing the second SOC calculated previously at the charging state or the discharging state to act as the SOC-1 to enable continuous calculation of the second SOC. When the battery enters the idle state from the charging state or the discharging state, employing the second SOC calculated via the coulomb counting method before entering the idle state to act as the SOC-1 to calculate the first SOC via Ohm's law.

In the embodiment, the method further includes: determining the SOC-2 according to the first SOC and the second SOC. Determining the SOC-2 according to the first SOC and the second SOC includes: determining that the SOC-2 is the first SOC when the first SOC is updated; and determining that the SOC-2 is the second SOC when the second SOC is updated.

Step S24, updating an actual capacity-2 of the battery according to the first SOC and the second SOC.

In the embodiment, before updating an actual capacity-2 of the battery according to the first SOC and the second SOC, the method further includes: determining that the battery meets at least one preset condition.

In the embodiment, the at least one preset condition includes at least one of the following conditions: the current battery temperature is within a preset range; a product of the sampling interval of the battery current and the current battery current is greater than a preset threshold; the OCV is within a stable region of the first relation model table; and a difference between the SOC-2 and the initialized SOC or a difference between the SOC-2 and the SOC of the battery during a previous updating of the actual capacity-2 of the battery is greater than a preset value.

Figure 5:
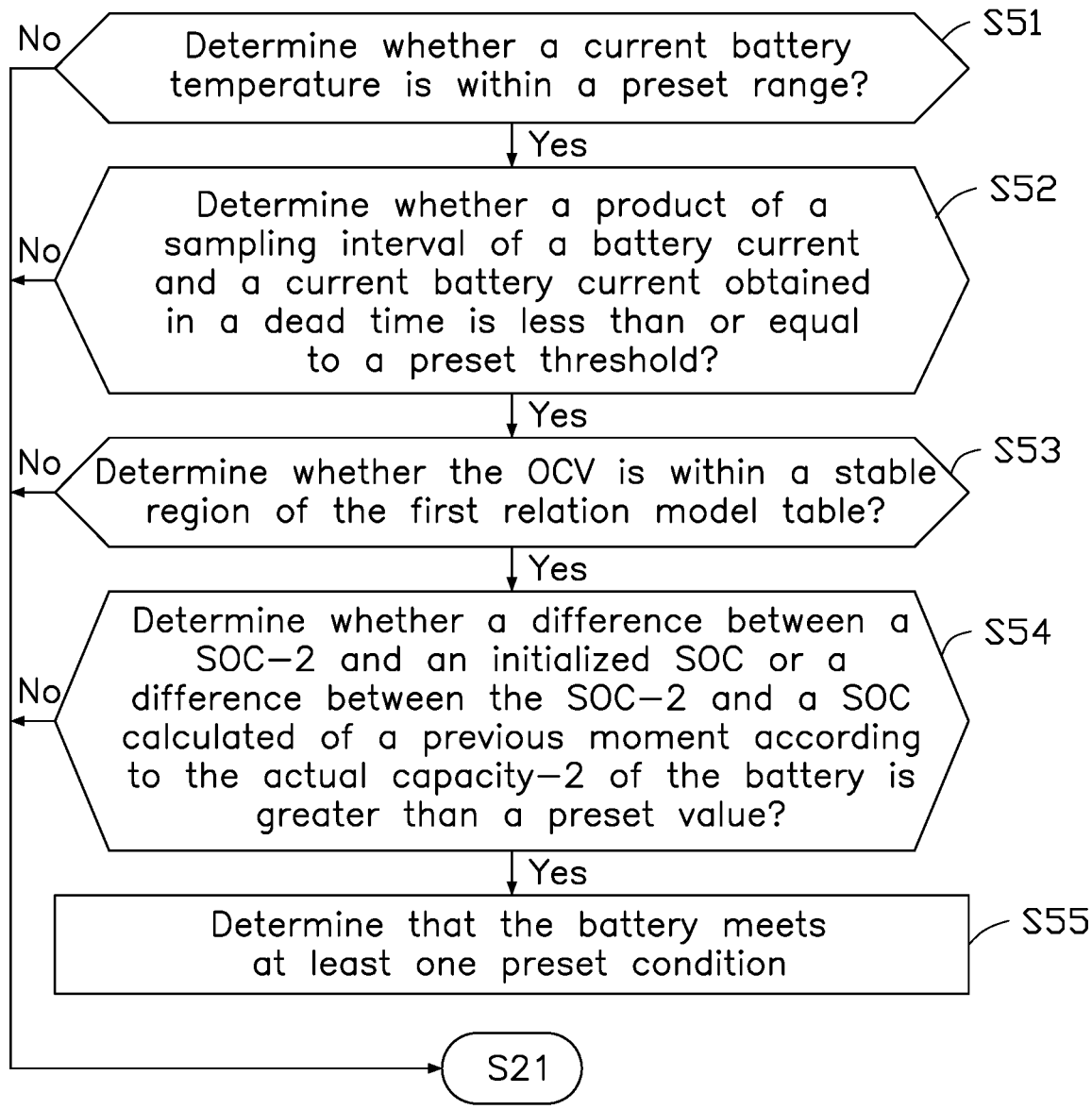
FIG. 5 is a flowchart describing a process for determining that the battery meets at least one preset condition.

In detail, determining that the battery meets at least one preset condition includes, as shown in FIG. 5:

Step S51: determining whether the current battery temperature is within the preset range. If the current battery temperature is within the preset range, the procedure goes to step S52. If the current battery temperature is not within the preset range, the procedure goes to step S21.

Preferably, the preset range is 10° C.-40° C., or other value according to specific requirements. In the embodiment, if the battery temperature is not within the preset range, the OCV of the battery loses accuracy. Thus, loss of accuracy of the OCV of the battery can be avoided by limiting the current battery temperature within the preset range for readings.

Step S52: determining whether the product of the sampling interval of the battery current and the current battery current obtained in the dead time is less than or equal to a preset threshold. If the product of the sampling interval of the battery current and the current battery current obtained in the dead time is greater than a preset threshold, the procedure goes to step S21. If the product of the sampling interval of the battery current and the current battery current obtained in the dead time is less than or equal to a preset threshold, the procedure goes to step S53.

Preferably, the preset threshold is within a range of 0.8%*$Q_{design}$ to 1.2%*$Q_{deign}$, or other values according to specific requirements. Where, $Q_{design}$ is the preset capacity. In the embodiment, limiting the product of the sampling interval of the battery current and the current battery current obtained in the dead time to be less than or equal to the preset threshold will decrease an accumulated error in obtaining the current.

Step S53: determining whether the OCV is within a stable region of the first relation model table. If the OCV is within such region of the first relation model table, go to step S54. If the OCV is not within such region of the first relation model table, go to step S21.

Preferably, the stable region of the first relation model table is that a lower threshold of the SOC of the battery is 10% and an upper threshold of the SOC of the battery is 90%. Preferably, the stable region of the first relation model table is that a lower threshold of the SOC of the battery is 20% and an upper threshold of the SOC of the battery is 80%, or other values according to specific requirements. In the embodiment, limiting the OCV being within such region of the first relation model table, results in a smaller variation of the OCV. Thus, SOC accuracy of the battery is improved.

Step S54: determining whether a difference between the SOC-2 and the initialized SOC or a difference between the SOC-2 and the SOC calculated of the previous moment according to the actual capacity-2 of the battery is greater than the preset value. If the difference between the SOC-2 and the initialized SOC or a difference between the SOC-2 and the SOC calculated of the previous moment according to the actual capacity-2 of the battery is greater than the preset value, the procedure goes to step S55. If the difference between the SOC-2 and the initialized SOC or a difference between the SOC-2 and the SOC calculated of the previous moment according to the actual capacity-2 of the battery is less than or equal to the preset value, the procedure goes to step S21.

Figure 6:
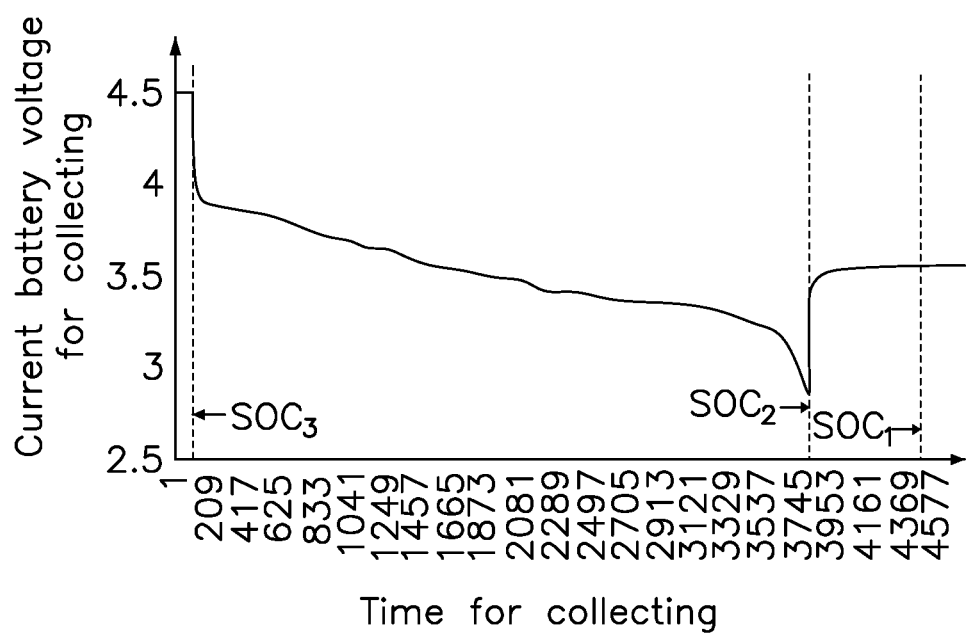
FIG. 6 shows a collected current battery voltage vs. collected time curve chart.

In the embodiment, when detecting that the battery actual capacity is not updated, determining whether a difference between the SOC-2 and the initialized SOC is greater than the preset value, as shown in FIG. 6, determining whether a difference between the SOC of the battery at 3745 seconds and the SOC of the battery at 209 seconds is greater than the preset value. When detecting that the battery actual capacity has been updated, determining whether a difference between the SOC-2 and the SOC calculated of the previous moment according to the actual capacity-2 of the battery is greater than the preset value. Preferably, the preset value is 40%, or other value according to specific requirement. In the embodiment, limiting a difference between the SOC-2 and the initialized SOC or a difference between the SOC-2 and the SOC calculated of the previous moment according to the actual capacity-2 of the battery to be greater than the preset value, will avoid inaccuracy in the battery actual capacity based on a small variation of the SOC of the battery.

Step S55, determining that the battery meets at least one preset condition.

Obviously, determining that the battery meets at least one preset condition is not limited to the above embodiment, it can be varied, for example, a sequence of the step S51, the step S52, the step S53, and the step S54 can be adjusted according to the need, or any one, two, or three steps from the step S51, the step S52, the step S53, and the step S54 can be omitted.

Figure 7:
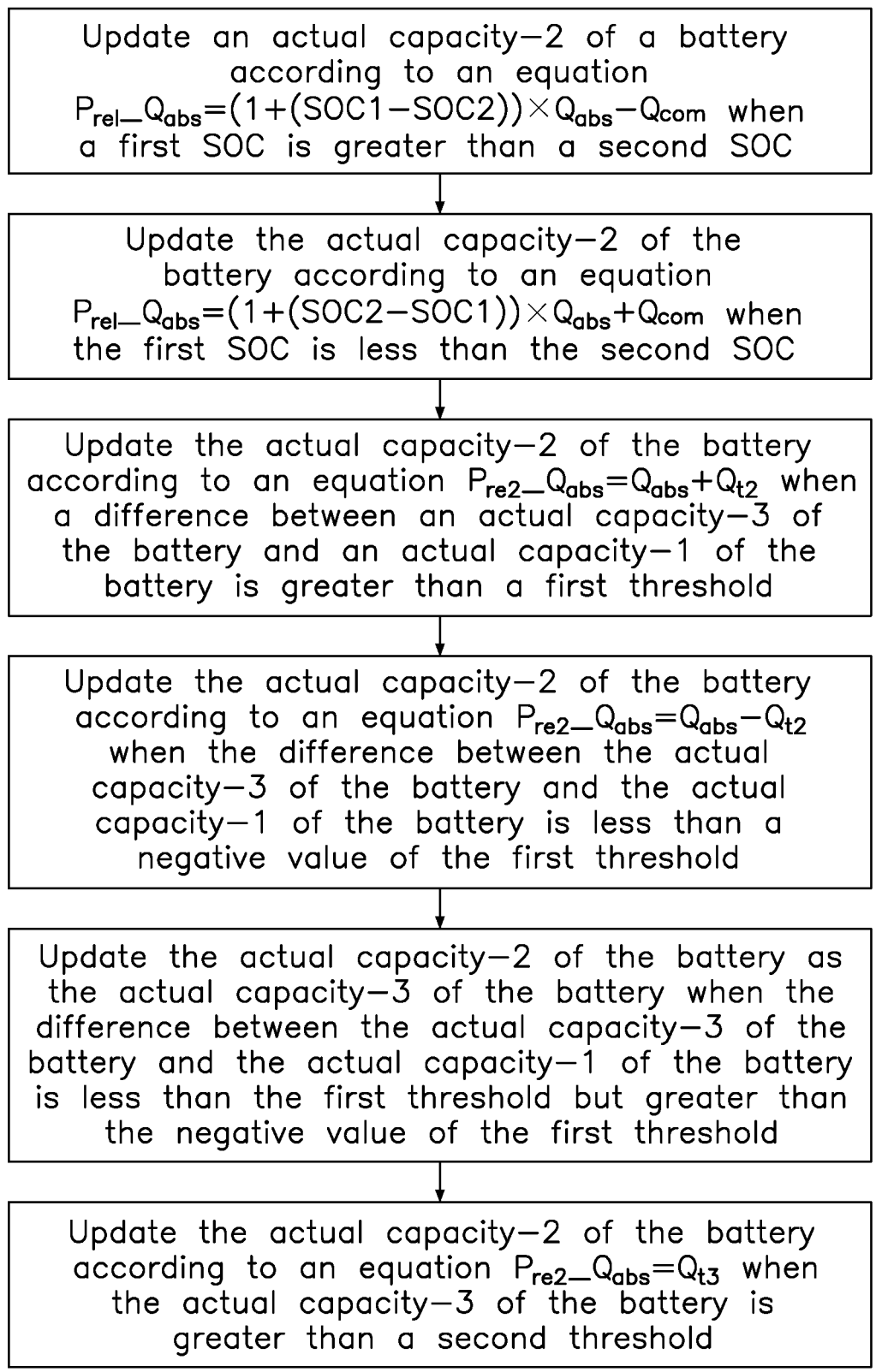
FIG. 7 is a flowchart of a method for updating actual capacity-2 of the battery.

In the embodiment, as shown in FIG. 7, updating an actual capacity-2 of the battery according to the first SOC and the second SOC includes: updating the actual capacity-2 of the battery according to an equation $Pre1\_Q_{abs}=(1+(SOC_1-SOC_2))\times Q_{abs}-Q_{com}$ when the first SOC is greater than the second SOC. Where $Pre1\_Q_{abs}$ is an actual capacity-3 of the battery, $SOC_1$ is the first SOC, $SOC_2$ is the second SOC, $Q_{abs}$ is the actual capacity-1 of the battery, and $Q_{com}$ is a compensation value.

In the embodiment, the compensation value is zero when the first SOC and the second SOC are each within a preset interval. In the embodiment, a lower threshold of the preset interval is 0.0, and an upper threshold of the preset interval is 1.0. Determining the compensation value according to the first SOC and the second SOC when both, the first SOC and the second SOC, are not within the preset interval.

In the embodiment, updating an actual capacity-2 of the battery according to the first SOC and the second SOC further includes: updating the actual capacity-2 of the battery according to an equation $Pre1\_Q_{abs}=(1+(SOC_2-SOC_1))\times Q_{abs}+Q_{com}$ when the first SOC is less than the second SOC. Where, $Pre1\_Q_{abs}$ is the actual capacity-3 of the battery, $SOC_2$ is the second SOC, $SOC_1$ is the first SOC, $Q_{abs}$ is the actual capacity-1 of the battery, and $Q_{com}$ is the compensation value.

In the embodiment, limiting the compensation value avoids the calculated first SOC and the calculated second SOC not being within the preset interval induced by a sampling or other error of the analog to digital converter, thus compensating against an abnormal value exceeding the preset interval to make the first SOC and the second SOC to be within the normal range.

In the embodiment, updating an actual capacity-2 of the battery according to the first SOC and the second SOC further includes: updating the actual capacity-2 of the battery according to an equation $Pre2\_Q_{abs}=Q_{abs}+Q_{t2}$ when a difference between the actual capacity-3 of the battery and the actual capacity-1 of the battery is greater than a first threshold. Where, $Pre2\_Q_{abs}$ is the actual capacity-2 of the battery, $Q_{abs}$ is the actual capacity-1 of the battery, and $Qt2$ is the first threshold.

Preferably, the first threshold is equal to $f_1*Q_{design}$, $f_1$ is a value between a lower threshold 0.03 and an upper threshold 0.1, $Q_{design}$ is the preset capacity, the first threshold can be other value according to specific requirements.

In the embodiment, updating an actual capacity-2 of the battery according to the first SOC and the second SOC can further include: updating the actual capacity-2 of the battery according to an equation $Pre2\_Q_{abs}=Q_{abs}-Q_{t2}$ when the difference between the actual capacity-3 of the battery and the actual capacity-1 of the battery is less than a negative value of the first threshold. Where, $Pre2\_Q_{abs}$ is the actual capacity-2 of the battery, $Q_{cabs}$ is the actual capacity-1 of the battery, and $Qt2$ is the first threshold.

In the embodiment, updating an actual capacity-2 of the battery according to the first SOC and the second SOC can further include: updating the actual capacity-2 of the battery as the actual capacity-3 of the battery when the difference between the actual capacity-3 of the battery and the actual capacity-1 of the battery is less than the first threshold but greater than the negative value of the first threshold.

Updating an actual capacity-2 of the battery according to the first SOC and the second SOC can further include: updating the actual capacity-2 of the battery according to an equation $Pre2\_Q_{abs}=Q_{t3}$ when the actual capacity-3 of the battery is greater than a second threshold. Where, $Pre2\_Q_{abs}$ is the actual capacity-2 of the battery, and $Q_{t3}$ is the second threshold.

Preferably, the second threshold being equal to $f_2*Q_{design}$, $f_2$ is a value between a lower threshold 1.1 and an upper threshold 1.5, where $Q_{design}$ is the preset capacity. The second threshold can be other value according to specific requirements.

In the embodiment, updating an actual capacity-2 of the battery according to the first SOC and the second SOC can be varied, for example, after determining the actual capacity-3 of the battery, the method further includes: updating the actual capacity-2 of the battery as the actual capacity-3 of the battery.

In the embodiment, updating an actual capacity-2 of the battery according to the first SOC and the second SOC can be varied. For example, after the actual capacity-3 of the battery is found to be greater than the second threshold and so updating the actual capacity-2 of the battery. When updating the actual capacity-2 of the battery, if a difference between the actual capacity-3 of the battery and the actual capacity-1 of the battery is greater than the first threshold, a process of the method can be varied to: if the actual capacity-3 of the battery is less than or equal to the second threshold, and the difference between the actual capacity-3 of the battery and the actual capacity-1 of the battery is greater than the first threshold.

In the embodiment, the actual capacity-1 of the battery employed to calculate the second SOC via the coulomb counting method is the actual capacity-1 of the battery calculated via the present disclosure. Simultaneously, the actual capacity-2 of the battery will act as the actual capacity-1 of the battery to calculate a next battery actual capacity via the coulomb counting method.

Figure 8:
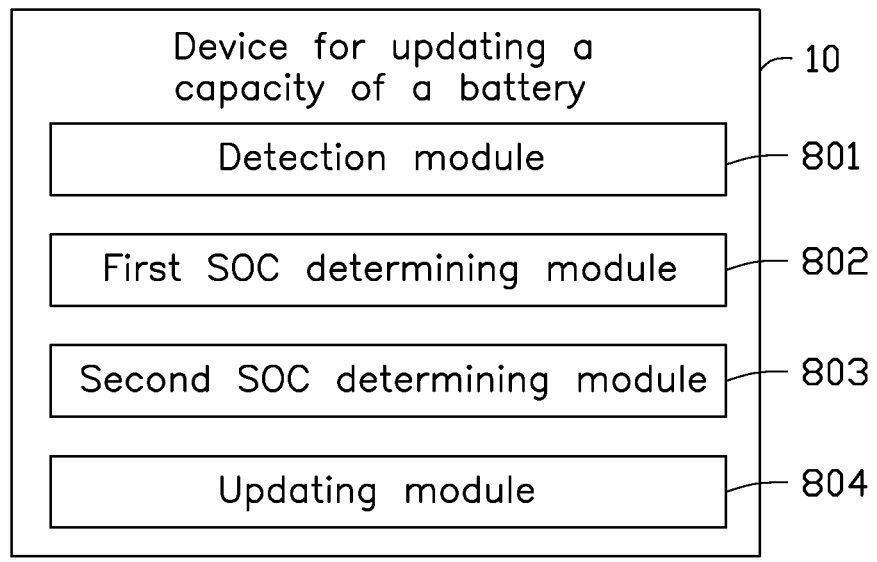
FIG. 8 is a block diagram of a device for updating the capacity of a battery.

Referring to FIG. 8, in at least one embodiment, the device for updating the capacity of a battery 10 can be divided into one or more modules/units. The one or more modules/units can be stored in the storage unit and executed by the at least one processor to accomplish the present disclosure. In the embodiment, one processor is employed in the present disclosure. The one or more modules/units can be a series of program instruction segments which can perform specific functions, and the instruction segment is configured to describe the execution process of the device for updating the capacity of a battery 10 in the electronic device. For example, the device for updating the capacity of a battery 10 can be divided into a detection module 801, a first SOC determining module 802, a second SOC determining module 803, and an updating module 804, as sheen in FIG. 8.

The detection module 801 is configured to detect a SOC-1 and an actual capacity-1 of the battery. The first SOC determining module 802 is configured to determine a first SOC according to the SOC-1. The second SOC determining module 803 is configured to determine a second SOC according to the SOC-1 and the actual capacity-1 of the battery. The updating module 804 is configured to update an actual capacity-2 of the battery according to the first SOC and the second SOC.

The device for updating the capacity of a battery of the present disclosure timely updates as the real capacity of the battery. The details can refer to the related embodiment of the method for updating the capacity of a battery, which will not be described herein.

In the embodiment, the storage unit is an inner storage unit of the electronic device, namely a built-in storage unit of the electronic device. In other embodiments, the storage unit can also be an external storage unit, namely a peripheral storage unit of the electronic device.

In the embodiment, the storage unit is configured to store program code and various data, for example store program code of the device for updating the capacity of a battery 10 stored in the electronic device, and complete high-speed and automatic accessing of program or data during the operation of the electronic device.

The storage unit can include high-speed random access memory. The storage unit can further include non-transitory storage medium, such as hard disk, memory, plug-in hard disk, smart media card, secure digital, flash card, at least one disk storage device, flash memory, or other transitory storage medium.

In at least one embodiment, the at least one processor can be one or more central processing units, or it can be one or more other universal processors, digital signal processors, application specific integrated circuits, field-programmable gate arrays, or other programmable logic devices, discrete gate or transistor logic, discrete hardware components, and so on. The universal processor can be a microprocessor or the at least one processor can be any regular processor, or the like.

If the modules/units of the device for updating the capacity of a battery 10 are implemented in the form of or by means of a software functional unit installed in independent or standalone product, all parts of the integrated modules/units of the storage unit may be stored in a computer-readable storage medium. One or more programs are used to control the related hardware to accomplish all parts of the methods of this disclosure. The one or more programs can be stored in a computer-readable storage medium. The one or more programs can accomplish the step of the exemplary method when executed by the at least one processor. The one or more stored programs can include program code. The program code can be in the form of source code, object code, executable code file, or in some intermediate form. The computer-readable storage medium may include any entity or device capable of recording and carrying the program codes, recording media, USB flash disk, mobile hard disk, disk, computer-readable storage medium, read-only memory, random access memory, electrical carrier signals, telecommunications signals, and software distribution package. The content stored in the computer-readable storage medium can be increased or decreased in accordance with legislative requirements and regulations of patent practice jurisdictions, for example, in some jurisdictions, legislation and patent practice stipulates that computer-readable storage medium does not include electrical carrier signals or telecommunications signals.

Division of the modules is only a logical function division, and other division manners may be adopted during practical implementation. Each function module in each embodiment of the present disclosure may be integrated into a processing module, each module may also exist independently and physically, and two or more than two modules may also be integrated into a module. The above-mentioned integrated module may be implemented in a form of hardware, and may also be implemented in forms of hardware and software function module.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for updating a capacity of a battery, comprising:

detecting a state of charge-1 of the battery and an actual capacity-1 of the battery;

determining a first state of charge according to the state of charge-1 of the battery via Ohm's law;

determining a second state of charge according to the state of charge-1 of the battery and the actual capacity-1 of the battery; and updating an actual capacity-2 of the battery according to the first state of charge and the second state of charge;

wherein determining the first state of charge according to the state of charge-1 of the battery via the Ohm's law comprises:

determining an impedance of the battery according to the state of charge-1 of the battery;

determining an open circuit voltage $V_{alid\_OCV} = V_{bat} - I_{bat} \times R(SOC, T_{bat})$, where $V_{bat}$ is a current battery voltage, $I_{bat}$ is a current battery current, and $R(SOC, T_{bat})$ is an impedance of the battery; and determining the first state of charge according to the open circuit voltage.

2. The method for updating the capacity of the battery of claim 1, further comprising:

determining a state of charge-2 of the battery according to the first state of charge and the second state of charge.

3. The method for updating the capacity of the battery of claim 1, wherein the state of charge-1 of the battery is an initialized state of charge and the actual capacity-1 of the battery is a preset capacity when the second state of charge is determined for the first time.

4. The method for updating the capacity of the battery of claim 3, further comprising:

determining an open-circuit voltage; and determining the initialized state of charge according to the open-circuit voltage.

5. The method for updating the capacity of the battery of claim 4, wherein determining an open-circuit voltage comprises:

determining that the open-circuit voltage is a current battery voltage.

6. The method for updating the capacity of the battery of claim 4, wherein determining the initialized state of charge according to the open-circuit voltage comprises:

querying a first relation model table to determine the initialized state of charge according to the open-circuit voltage.

7. The method for updating the capacity of the battery of claim 1, wherein determining an impedance of the battery according to the state of charge-1 of the battery comprises:

querying a second relation model table to determine the impedance of the battery according to the state of charge-1 of the battery and a current battery temperature.

8. The method for updating the capacity of the battery of claim 1, wherein determining a second state of charge according to the state of charge-1 of the battery and the actual capacity-1 of the battery comprises:

determining the second state of charge according to the state of charge-1 of the battery and the actual capacity-1 of the battery via a coulomb counting method.

9. The method for updating the capacity of the battery of claim 8, wherein determining the second state of charge according to the state of charge-1 of the battery and the actual capacity-1 of the battery via a coulomb counting method comprises:

determining the second state of charge according to the state of charge-1 of the battery, a current battery current, a sampling interval of obtaining the battery current, and the actual capacity-1 of the battery via the coulomb counting method.

10. The method for updating the capacity of the battery of claim 9, wherein the coulomb counting method comprises:

$$SOC_2=SOC_0+I_{bat}\times\Delta t/Q_{abs};$$

where $SOC_2$ is the second state of charge, $SOC_0$ is the state of charge-1 of the battery, $I_{bat}$ is the current battery current, $\Delta t$ is the sampling interval of obtaining the battery current, and $Q_{abs}$ is the actual capacity-1 of the battery.

11. The method for updating the capacity of the battery of claim 1, wherein before updating an actual capacity-2 of the battery according to the first state of charge and the second state of charge, the method for updating a capacity of a battery further comprises:
  determining that a battery meets at least one preset condition.

12. The method for updating the capacity of the battery of claim 11, wherein the at least one preset condition comprises at least one condition selected from the group consisting of:
  a current battery temperature is within a preset range;
  a product of a sampling interval of obtaining a battery current and a current battery current obtained in a dead time is less than or equal to a preset threshold;
  an open-circuit voltage is within a stable region of a first relation model table; and
  a difference between a state of charge-2 of the battery and an initialized state of charge or a difference between the state of charge-2 of the battery and a state of charge of the battery calculated of the previous moment according to the actual capacity-2 of the battery is greater than a preset value.

13. The method for updating the capacity of the battery of claim 1, wherein updating an actual capacity-2 of the battery according to the first state of charge and the second state of charge comprises:
  if the first state of charge is greater than the second state of charge, updating the actual capacity-2 of the battery according to an equation:

$$Pre1\_Q_{abs}(1+(SOC_1-SOC_2))\times Q_{abs}-Q_{com}$$

where $Pre1\_Q_{abs}$ is an actual capacity-3 of the battery, $SOC_1$ is the first state of charge, $SOC_2$ is the second state of charge, $Q_{abs}$ is the actual capacity-1 of the battery, and $Q_{com}$ is a compensation value.

14. The method for updating the capacity of the battery of claim 13, further comprising:
  if the first state of charge is less than the second state of charge, updating the actual capacity-2 of the battery according to an equation:

$$Pre1\_Q_{abs}(1+(SOC_1-SOC_2))\times Q_{abs}-Q_{com}$$

where $Pre1\_Q_{abs}$ is the actual capacity-3 of the battery, $SOC_2$ is the second state of charge, $SOC_1$ is the first state of charge, $Q_{abs}$ is the actual capacity-1 of the battery, and $Q_{com}$ is the compensation value.

15. The method for updating the capacity of the battery of claim 13, wherein the compensation value is zero when the first state of charge and the second state of charge are each within a preset interval.

16. The method for updating the capacity of the battery of claim 15, wherein a lower threshold of the preset interval is 0.0 and an upper threshold of the preset interval is 1.0.

17. The method for updating the capacity of the battery of claim 14, further comprising:
  updating the actual capacity-2 of the battery as the actual capacity-3 of the battery.

18. The method for updating the capacity of the battery of claim 14, further comprising:
  if a difference between the actual capacity-3 of the battery and the actual capacity-1 of the battery is greater than a first threshold, updating the actual capacity-2 of the battery according to an equation:

$$Pre2\_Q_{abs}=Q_{abs}+Q_{t2}$$

where $Pre2\_Q_{abs}$ is the actual capacity-2 of the battery, $Q_{abs}$ is the actual capacity-1 of the battery, and $Q_{t2}$ is the first threshold.

19. The method for updating the capacity of the battery of claim 18, further comprising:
  if the difference between the actual capacity-3 of the battery and the actual capacity-1 of the battery is less than a negative value of the first threshold, updating the actual capacity-2 of the battery according to an equation:

$$Pre2\_Q_{abs}=Q_{abs}-Q_{t2}$$

where $Pre2\_Q_{abs}$ is 0 the actual capacity-2 of the battery, $Q_{abs}$ is the actual capacity-1 of the battery, and $Q_{t2}$ is the first threshold.

20. The method for updating the capacity of the battery of claim 19, further comprising:
  updating the actual capacity-2 of the battery as the actual capacity-3 of the battery when the difference between the actual capacity-3 of the battery and the actual capacity-1 of the battery is less than the first threshold and greater than the negative value of the first threshold.

21. The method for updating the capacity of the battery of claim 19, wherein the first threshold is equal to $f_1*Q_{design}$, where $f_1$ is a value between a lower threshold 0.03 and an upper threshold 0.1, and $Q_{design}$ is a preset capacity.

22. The method for updating the capacity of the battery of claim 18, further comprising:
  if the actual capacity-3 of the battery is greater than a second threshold, updating the actual capacity-2 of the battery according to an equation:

$$Pre2\_Q_{abs}=Q_{t3}$$

where $Pre2\_Q_{abs}$ is the actual capacity-2 of the battery, and $Q_{t3}$ is the second threshold.

23. The method for updating the capacity of the battery of claim 22, wherein the second threshold is equal to $f_2*Q_{design}$, where $f_2$ is a value between a lower threshold 1.1 and an upper threshold 1.5, and $Q_{design}$ is a preset capacity.

24. The method for updating the capacity of the battery of claim 1, further comprising:
  stopping an update of the first state of charge if a battery is in charging state or discharging state; and
  updating the first state of charge according to the state of charge-1 of the battery if the battery is in idle state.

25. The method for updating the capacity of the battery of claim 24, further comprising:
  detecting a state of the battery, the state of the battery being one from a group of the charging state, the discharging state, and the idle state.

26. The method for updating the capacity of the battery of claim 1, further comprising:
  updating the second state of charge according to the state of charge-1 of the battery and the actual capacity-1 of the battery if the battery is in charging state or discharging state; and keeping the value of the second state of charge if the battery is in idle state.

27. An electronic device comprising:
a battery;
at least one processor; and
a storage system storing one or more programs which when executed by the at least one processor, cause the at least one processor to:
detect a state of charge-1 of the battery and an actual capacity-1 of the battery;
determine a first state of charge according to the state of charge-1 of the battery via Ohm's law;
determine a second state of charge according to the state of charge-1 of the battery and the actual capacity-1 of the battery; and
update an actual capacity-2 of the battery according to the first state of charge and the second state of charge;
wherein in determining the first state of charge according to the state of charge-1 of the battery via the Ohm's law, the one or more programs cause the at least one processor to:
determine an impedance of the battery according to the state of charge-1 of the battery;
determine an open circuit voltage $V_{alid\_OCV}=V_{bat}-I_{bat}\times R(SOC,T_{bat})$, where $V_{bat}$ is a current battery voltage, $I_{bat}$ is a current battery current, and $R(SOC, T_{bat})$ is an impedance of the battery; and
determine the first state of charge according to the open circuit voltage.

28. A non-transitory storage medium having stored thereon instructions that, when executed by a processor of an electronic device, causes the processor to:
detect a state of charge-1 of the battery and an actual capacity-1 of the battery;
determine a first state of charge according to the state of charge-1 of the battery;
determine a second state of charge according to the state of charge-1 of the battery and the actual capacity-1 of the battery; and
update an actual capacity-2 of the battery according to the first state of charge and the second state of charge,
wherein in determining the first state of charge according to the state of charge-1 of the battery via the Ohm's law, the instructions cause the processor to:
determine an impedance of the battery according to the state of charge-1 of the battery;
determine an open circuit voltage $V_{alid\_OCV}=V_{bat}-I_{bat}\times R(SOC,T_{bat})$, where $V_{bat}$ is a current battery voltage, $I_{bat}$ is a current battery current, and $R(SOC, T_{bat})$ is an impedance of the battery; and
determine the first state of charge according to the open circuit voltage.

* * * * *